United States Patent
Schnell et al.

(10) Patent No.: US 11,243,584 B2
(45) Date of Patent: Feb. 8, 2022

(54) COOLING SYSTEM WITH ACOUSTIC NOISE CONTROL IN AN INFORMATION HANDLING SYSTEM

(71) Applicant: Dell Products L.P., Round Rock, TX (US)

(72) Inventors: Tom Schnell, Hutto, TX (US); Qinghong He, Austin, TX (US); Man Tak Ho, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 74 days.

(21) Appl. No.: 16/890,590

(22) Filed: Jun. 2, 2020

(65) Prior Publication Data

US 2021/0373624 A1    Dec. 2, 2021

(51) Int. Cl.
*G06F 1/20* (2006.01)
*G06F 1/18* (2006.01)
*H05K 7/20* (2006.01)

(52) U.S. Cl.
CPC ............... *G06F 1/20* (2013.01); *G06F 1/181* (2013.01); *H05K 7/20145* (2013.01); *H05K 7/20172* (2013.01)

(58) Field of Classification Search
CPC . G06F 1/20; G06F 1/203; G06F 1/206; G06F 2200/201; G06F 1/181; H05K 7/20145; H05K 7/20172; H05K 7/20836; H05K 7/20736; H05K 7/20727; H05K 7/20136; H05K 7/20209; H05K 7/20181; H01L 23/467
USPC .. 361/695, 679.48, 690, 694, 679.49, 679.5, 361/697, 692, 679.47, 719, 724, 688; 454/184, 486; 165/80.3, 104.33, 80.2
See application file for complete search history.

(56) References Cited

U.S. PATENT DOCUMENTS

2019/0227605 A1*   7/2019  Wiltzius ................... G06F 1/20

* cited by examiner

*Primary Examiner* — Mandeep S Buttar
(74) *Attorney, Agent, or Firm* — Baker Botts L.L.P.

(57) ABSTRACT

A component-level cooling system for cooling components in a chassis includes a fan in a housing positioned on a circuit board. The housing has a fan inlet on a side, a first fan outlet on one end and a second fan outlet on a second end opposite the first end. The first fan outlet may direct a first airflow in a first direction to a vent on a first panel of the chassis. The second fan outlet may direct a second airflow in a second direction opposite the first direction. A duct comprises a duct inlet for receiving the second airflow, an elbow for redirecting the second airflow in a third direction to avoid the second airflow from colliding with a main airflow to reduce acoustic noise, and a duct outlet located to avoid heated air exiting the duct from re-entering the fan inlet.

18 Claims, 6 Drawing Sheets

COOLING SYSTEM WITH ACOUSTIC NOISE CONTROL IN AN INFORMATION HANDLING SYSTEM

BACKGROUND

Field of the Disclosure

This disclosure relates generally to information handling systems and, more particularly, to cooling systems with acoustic noise control for an information handling system.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include servers, gaming systems, desktop computers, and other information handling systems. Generally, an information handling system is contained in a chassis with a set of fans generating airflow through the chassis to cool components.

SUMMARY

As information handling systems increase in complexity and performance capabilities, cooling the components and the chassis also increases in complexity. A common approach is to use airflow for convective heat transfer. The additional airflow may be needed to cool a larger number of components, as well as to cool more powerful components.

In one aspect, a disclosed cooling system for a circuit board in an information handling system includes a fan and a duct. The fan is coupled to the circuit board and comprises an inlet near a midpoint of the circuit board with outlets at either end. A first outlet of the fan may be oriented to direct a first airflow in a first direction to a first vent and a second outlet may be oriented to direct a second airflow in a second direction opposite the first direction. The duct comprises an intake positioned relative to the second outlet for receiving the second airflow. The duct is configured with a duct outlet oriented to direct the second airflow in a third direction to a second vent. The third direction may be orthogonal to the second direction.

The duct may include a plurality of curved channels for directing the second airflow to change from the second direction to the third direction and for reducing acoustic noise. The plurality of curved channels may extend from the intake through a portion of the duct, may extend from a portion of the duct to the duct outlet, or may extend from the intake through the duct to the duct outlet. The number, size, orientation and curvature of the plurality of curved channels may direct the second airflow to facilitate heat transfer and/or reduce acoustic noise.

The first vent may be a primary vent located on a back side of the information handling system and the second vent may be located on a side or door of the information handling system. In some embodiments, the second vent may be inside the chassis, but the duct is configured to direct the second airflow away from the fan inlet to prevent recirculation of heated air.

The duct outlet may be smaller, the same size, or larger than the intake to direct the second airflow to facilitate heat transfer and/or reduce acoustic noise.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments may be best understood by reference to FIGS. 1, 2A-2B, 3A-3B and 4-7, wherein like numbers are used to indicate like and corresponding parts.

Figure 1:
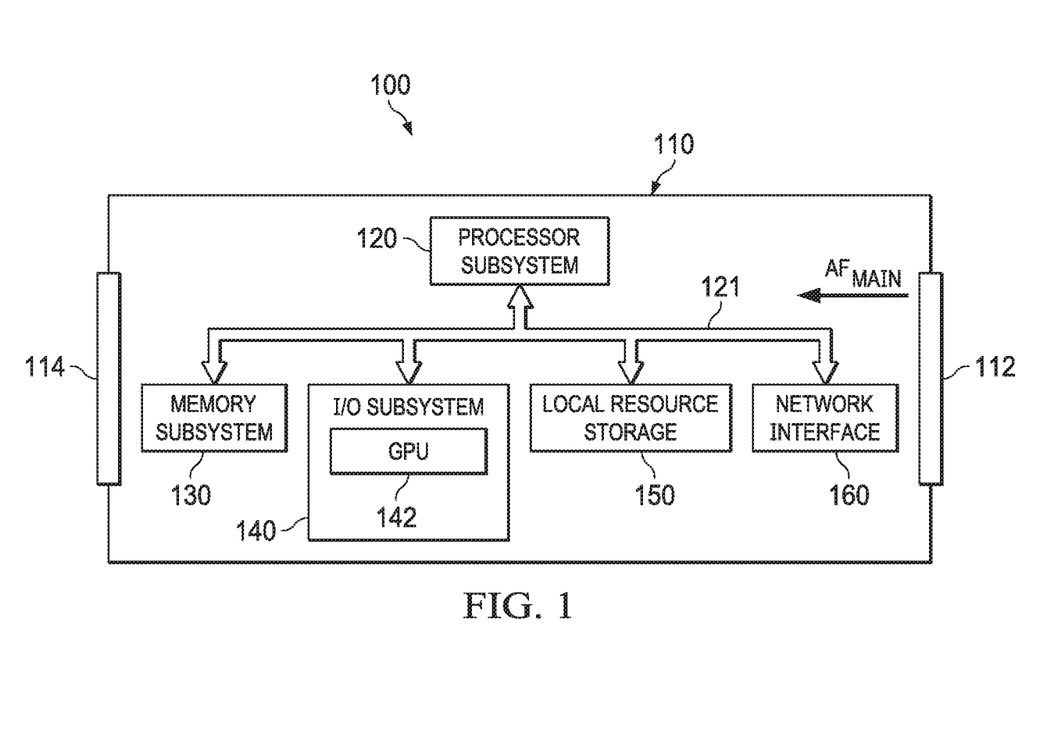
FIG. 1 is a block diagram of selected elements of an embodiment of an information handling system.

Turning now to the drawings, FIG. 1 illustrates a block diagram depicting selected elements of an embodiment of an information handling system 100 in a chassis 110 with fan 112 for generating an airflow ($AF_{MAIN}$) in chassis 110.

As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140 with graphics processing unit (GPU) 142 for processing information, local storage resource 150 and a network interface 160.

As depicted in FIG. 1, processor subsystem 120 may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Also, in FIG. 1, memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage or a suitable selection or array of volatile or non-volatile memory that retains data after power is removed.

In information handling system 100, I/O subsystem 140 may comprise a system, device, or apparatus generally operable to receive and transmit data to, from or within information handling system 100. I/O subsystem 140 may represent, for example, a variety of communication interfaces, graphics interfaces including one or more graphics processing units (GPUs) 142 for communicating with a display, video interfaces, user input interfaces, and peripheral interfaces. I/O subsystem 140 may include more, fewer, or different input/output devices or components.

Local storage resource 150 may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such as wires, optical fibers, microwaves, radio waves, and other electromagnetic or optical carriers; or any combination of the foregoing.

Still referring to FIG. 1, network interface 160 may be a suitable system, apparatus, or device operable to serve as an interface between information handling system 100 and a network (not shown). Network interface 160 may enable information handling system 100 to communicate over a network using a suitable transmission protocol or standard. In some embodiments, network interface 160 may be communicatively coupled via a network to a network storage resource (not shown). A network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to network interface 160 or various components associated therewith may be implemented using hardware, software, or any combination thereof.

Components of information handling system 100 generate heat in performing the processes or purposes as mentioned above and require cooling. One approach to cooling information handling systems 100 is by system-level cooling involving a set of main fans 112 generating an airflow through chassis 110.

As depicted in FIG. 1, one or more fans 112 in a main set of fans 112 are positioned on one side of chassis 110 and a vent 114 is positioned on an opposite side of chassis 110 such that fans 112 on the first side of chassis 110 generate a main airflow ($AF_{MAIN}$) that enters chassis 110 on the first side and flows in a first direction around components such as processors 120 of processor subsystem 120, memory subsystem 130, I/O subsystem 140, local resource 150 and network interface 160 in chassis 110 and exits vent 114 on the second side.

Figure 2A:
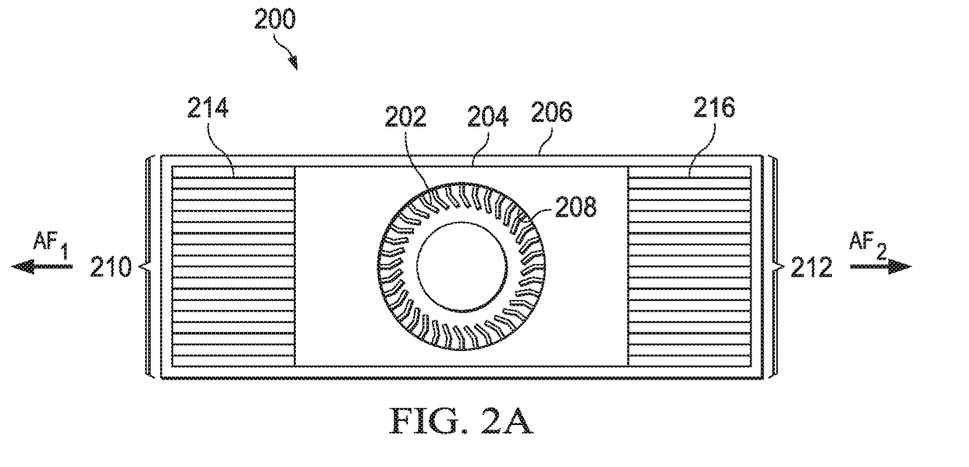
FIG. 2A is a bottom view of an example graphics card assembly for an information handling system with a fan housing configured with an inlet near a midpoint, a first outlet for directing a first airflow in a first direction and a second outlet for directing a second airflow in a second direction opposite the first direction.
Figure 2B:
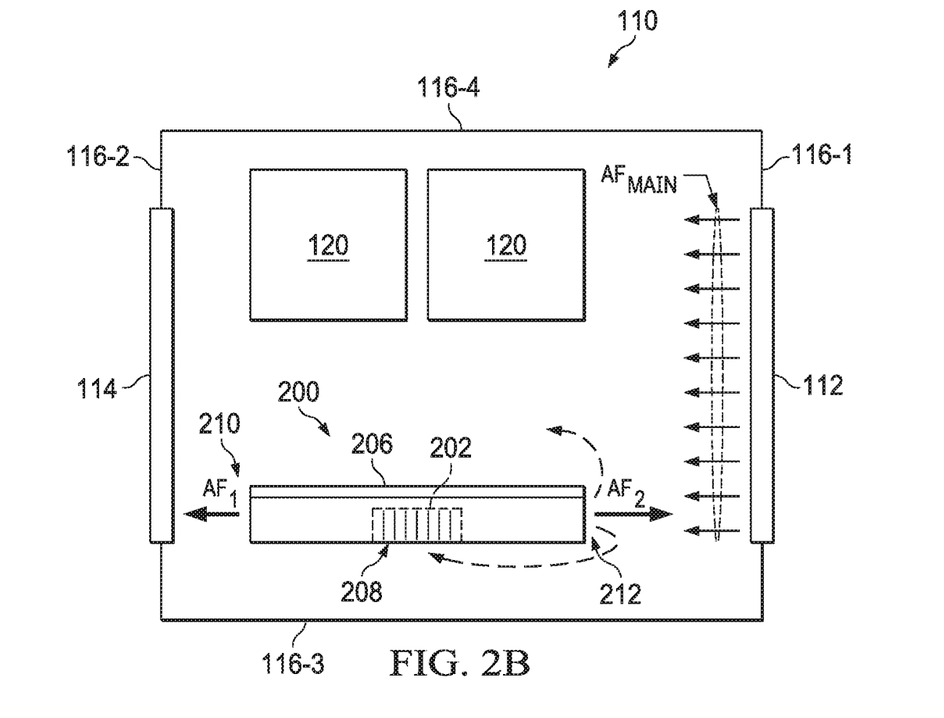
FIG. 2B is a side cutaway view of an example information handling system with the component-level cooling system of FIG. 2A positioned with a first outlet directing a first airflow to a first vent on a back side of the chassis and a second outlet directing a second airflow in a second direction opposite the first direction and colliding with a main airflow, illustrating a mechanism for acoustic noise and hot air recirculation.

Referring to FIGS. 2A and 2B, in addition to system-level cooling, information handling system 100 may include component-level cooling system 200.

Referring to FIG. 2A, component-level cooling system 200 for one or more components of information handling system 100 may include fan 202 positioned in housing 204, wherein fan 202 is configured for generating an airflow and housing 204 is configured for directing portions of the airflow into two opposite directions. Housing 204 of component-level cooling system 200 may be coupled to, for example, circuit board 206. Housing 204 may include fan inlet 208 open on one side and located near a midpoint of housing 204. Housing 204 may be configured to direct a first airflow ($AF_1$) in a first direction out first fan outlet 210 and direct a second airflow ($AF_2$) in a second direction to second fan outlet 212 located opposite first fan outlet 210. The positions of fan inlet 208, first fan outlet 210 and second fan outlet 212 may be configured to maximize the volume of cool airflow across fin stacks 214 and 216 to cool components on circuit board 206. In operation, fan 202 draws air in through fan inlet 208 and housing 204 directs a first airflow ($AF_1$) in a first direction across fin stack 214 for cooling components coupled to fin stack 214 and directs a second airflow ($AF_2$) in a second direction opposite the first direction to cool components coupled to fin stack 216.

FIG. 2B depicts a cutaway side view of chassis 110 comprising fan 112 and vent 114 configured to generate main airflow $AF_{MAIN}$ for system-level cooling of components in chassis 110 and further depicts one embodiment of component-level cooling system 200 for cooling a set of components in chassis 110. Main airflow $AF_{MAIN}$ generated by fan 112 may flow in a first direction and may be sufficient to cool components such as processors 120. However, main airflow $AF_{MAIN}$ may provide insufficient cooling of components on circuit board 206. As depicted in FIG. 2B, component-level cooling system 200 may be coupled to circuit board 206 and positioned such that air is drawn into fan 202 via fan inlet 208. A first airflow ($AF_1$) exits first fan outlet 210 and flows in the first direction, which may be the same direction as $AF_{MAIN}$ as depicted in FIG. 2B to vent 114 located on the second side of chassis 110, but the second airflow ($AF_2$) exits second fan outlet 212 and flows in a second direction toward main fan 112 located on the first side of chassis 110. A collision of second airflow ($AF_2$) with the main airflow ($AF_{MAIN}$) due to the direction of second airflow $AF_2$ may result in turbulence, which increases acoustic noise. Furthermore, a collision of second airflow ($AF_2$) with main airflow ($AF_{MAIN}$) may cause a portion of second airflow $AF_2$ to flow past fan inlet 208 and re-enter fan 202. If heated air associated with second airflow ($AF_2$) re-enters fan 202, the ability for fan 202 to effectively cool components on circuit board 206 may be reduced, requiring fan 202 to generate second airflow $AF_2$ at a higher flow rate and/or causing reduced processing by components on circuit board 206.

Embodiments disclosed herein may use a system-level cooling system to cool a plurality of components of information handling system 100 in chassis 110 and use a component-level cooling systems for one or more sets of components, wherein each component-level cooling system comprises a duct configured for redirecting the second airflow to avoid acoustic noise and an outlet positioned away from the fan inlet to prevent heated air from re-entering fan 200.

Figure 3A:
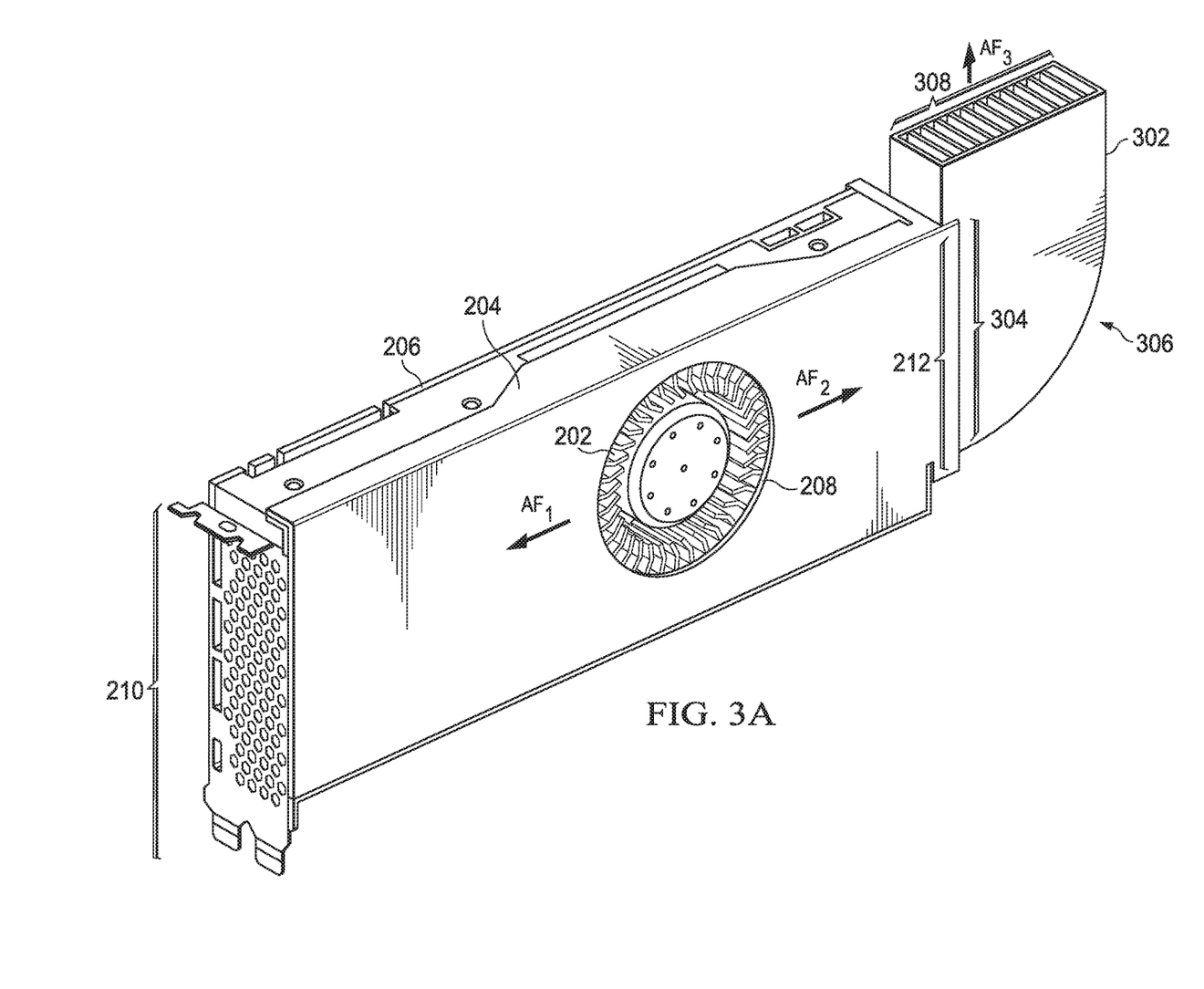
FIGS. 3A and 3B are perspective views of component-level cooling systems with ducts for preventing recirculation of hot air through a fan and for redirecting an airflow to avoid acoustic noise.
Figure 3B:
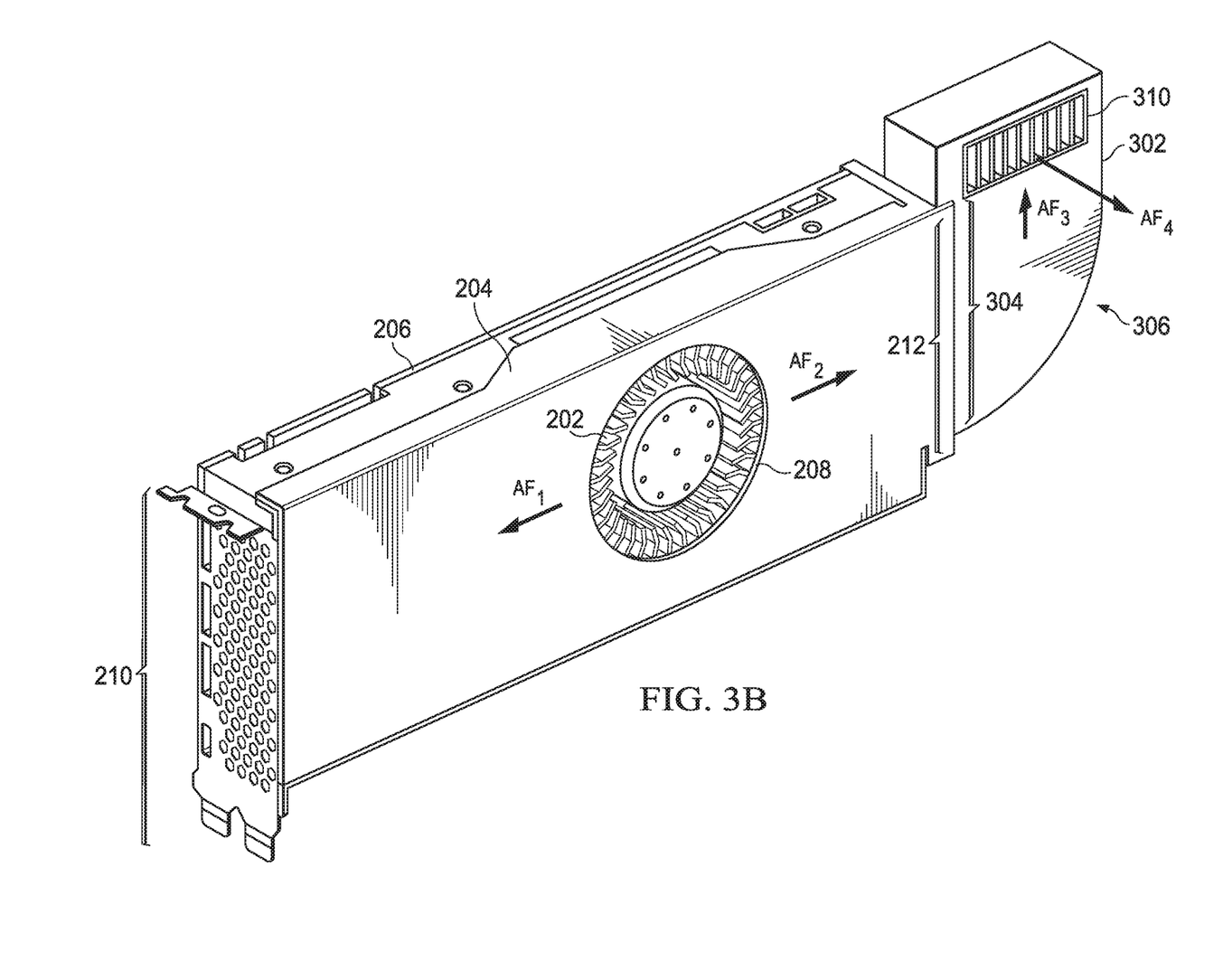

Referring to FIGS. 3A and 3B, component-level cooling system 300 may be coupled to, for example, circuit board 206 containing a set of heat-generating components (not visible in FIGS. 3A, 3B) of information handling system 100. Component-level cooling system 300 may include fan 202 in housing 204 coupled to circuit board 206, with fan inlet 208 open on one side of housing 204. Housing 204 may be positioned on circuit board 206 and configured with first fan outlet 210 to direct a first airflow ($AF_1$) in a first direction and second outlet 212 to direct a second airflow ($AF_2$) in a second direction opposite the first direction.

Also depicted in FIGS. 3A and 3B, component-level cooling system 300 comprises duct 302 with duct inlet 304 coupled to second fan outlet 212 for receiving second airflow ($AF_2$) generated by fan 202. Duct 302 further includes elbow 306 configured for redirecting second airflow ($AF_2$) in a third direction (represented as $AF_3$) to avoid a collision with main airflow ($AF_{MAIN}$) and duct outlet 308 oriented to prevent heated air from re-entering fan inlet 208.

As depicted in FIG. 3A, in some embodiments, duct 302 may be configured with elbow 306 having a curvature to redirect second airflow ($AF_2$) in a third direction to avoid a collision with main airflow ($AF_{MAIN}$). In some embodiments, elbow 306 may be configured with a curvature of approximately 90 degrees such that duct outlet 308 is orthogonal to duct inlet 304, wherein the second airflow ($AF_2$) enters duct 302 in a direction opposite the first direction associated with first airflow ($AF_1$) and elbow 306 is configured to redirect the second airflow ($AF_2$) to flow in a third direction orthogonal to the second direction. In some embodiments, duct 302 may be configured with duct outlet 308 formed on an end of duct 302, wherein first airflow (AF1) exits first fan outlet 210 in a first direction.

As depicted in FIG. 3B, in some embodiments, duct 302 may be configured with elbow 306 having a curvature to redirect second airflow ($AF_2$) in a third direction (represented as $AF_3$) and duct outlet 310 formed on a side of duct 302 to redirect the second airflow ($AF_2$) in a fourth direction (represented as $AF_4$). Embodiments of duct 302 may be further configured to minimize acoustic noise.

Figure 4:
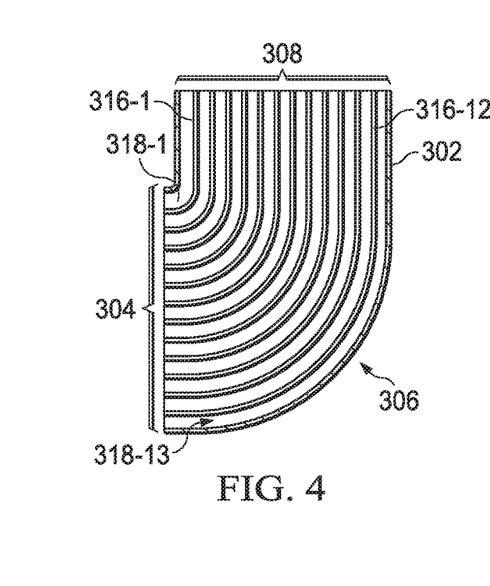
FIGS. 4-6 depict cross-section views of embodiments of a duct for preventing hot air recirculation and providing directional acoustic noise suppression.
Figure 5:
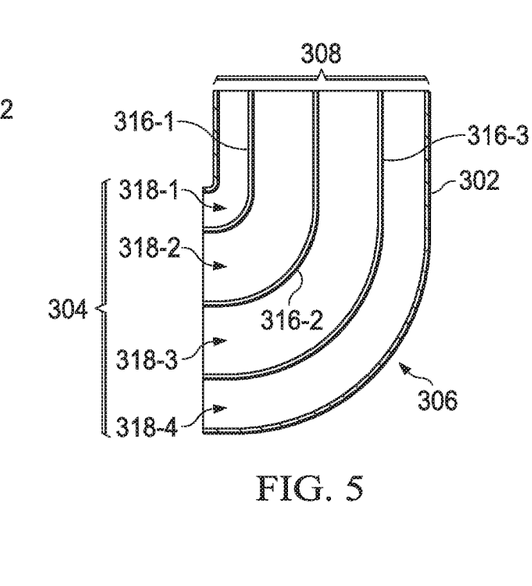
Figure 6:
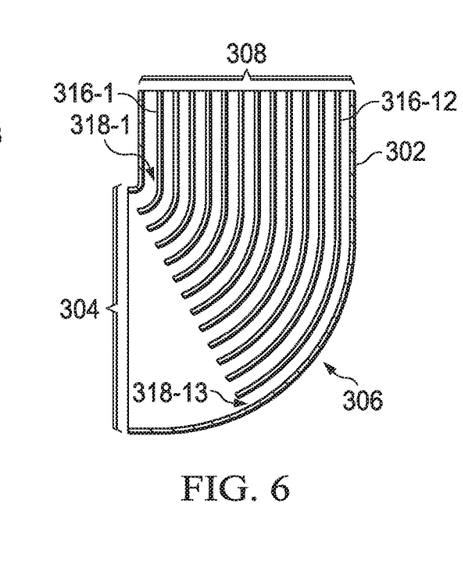

FIGS. 4-6 depict top views of embodiments of duct 302 with a plurality of walls 316 formed in at least a portion of elbow 306 to divide elbow 306 into a plurality of channels 318. As depicted in FIGS. 4-6, in some embodiments, duct 302 may be formed with a first end (e.g., duct inlet 304) larger than a second end (e.g., duct outlet 308). As depicted in FIG. 4, in some embodiments, walls 316-1 to 316-13 may be formed with concentric radii of curvature and extend through elbow 306 to divide elbow 306 into channels 318-1 to 318-13 for the entire length of duct 302. As depicted in FIG. 5, in some embodiments, each wall 316-1 to 316-3 may be configured with a radius of curvature and walls 316-1 to 316-3 divide elbow 306 into channels 318-1 to 318-4 for the entire length of duct 302. In FIG. 5, first wall 316-1 near the inside of elbow 306 may have a small radius of curvature such that second airflow ($AF_2$) makes a sharper turn and other walls 316-2 to 316-4 may have radii of curvature for more gradual turning of second airflow ($AF_2$). As depicted in FIG. 5, walls 316 may be formed asymmetrically in elbow 306 such that channels 318 may have different sizes. Walls 316 may be formed in only a portion of elbow 306. Walls 316 may extend from duct inlet 304 through a portion of elbow 306 or extend from duct outlet 308 through a portion of elbow 306. In some embodiments, walls 316 may be formed with a first end on a first side of the bend and a second end on a second side of the bend. As depicted in FIG. 6, walls 316-1 to 316-13 may be formed with a first end on a first side of the bend and a second end located at or proximate to duct outlet 308. In some embodiments, a bend may be between 30-90 degrees. As depicted in FIGS. 4-6, walls 316 in elbow 306 may be configured with a bend of approximately 90 degrees.

Figure 7:
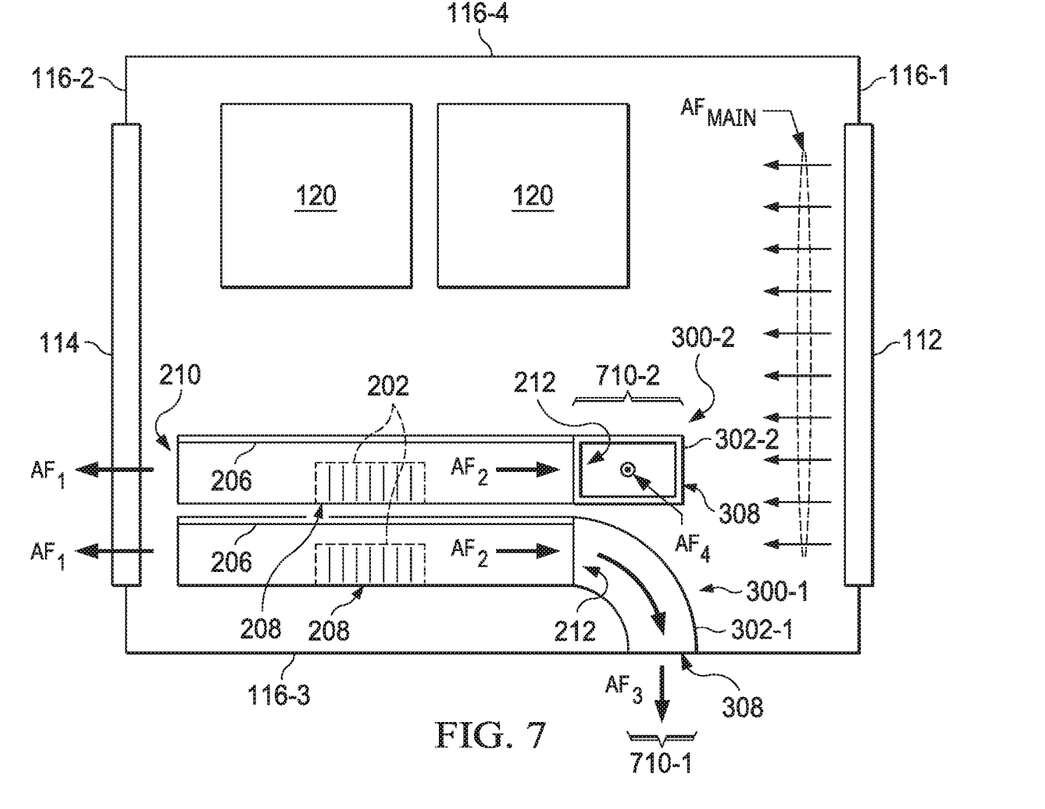
FIG. 7 is a side view of an example information handling system with a plurality of component-level cooling systems with ducts for directing airflows in various directions for avoiding acoustic noise and including a vent for preventing heated air from re-entering any fans.

Information handling system 100 may include a plurality of component-level cooling systems 300 and chassis 110 may be configured with multiple vents on one or more panels 116. Referring to FIG. 7, duct 302 for first component-level cooling system 300-1 may be configured to redirect second airflow ($AF_2$) in a third direction, and duct outlet 308 may be positioned by vent 710-1 on panel 116-3 and duct 302 for second component-level cooling system 300-2 may be configured to redirect second airflow ($AF_2$) in a fourth direction and duct outlet 308 may be positioned by vent 710-2 on a second panel (not shown).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A component-level cooling system for cooling individual components in a chassis of an information handling system having a main fan generating a main airflow in a first direction toward a first vent, the component-level cooling system comprising:
   a fan in a housing coupled to a circuit board, the housing comprising:
      a fan inlet for receiving air from inside the chassis;
      a first fan outlet configured to direct a first airflow in the first direction toward the first vent; and
      a second fan outlet configured to direct a second airflow in a second direction opposite the first direction; and
   a duct comprising:
      a duct inlet coupled to the second fan outlet for receiving the second airflow;
      an elbow configured to redirect the second airflow in a third direction to avoid a collision with the main airflow; and
      a duct outlet located to avoid heated air exiting the second fan outlet from re-entering the fan inlet.

2. The component-level cooling system of claim 1, wherein the duct outlet is larger than the duct inlet.

3. The component-level cooling system of claim 1, wherein:
   the duct outlet is located on a side of a second end of the duct to redirect the second airflow in a fourth direction to exit the duct outlet.

4. The component-level cooling system of claim 1, wherein the elbow comprises a plurality of walls formed in at least a portion of the elbow to divide the elbow into a plurality of channels.

5. The component-level cooling system of claim 4, wherein:
   the elbow comprises a bend greater than 60 degrees;
   a first end of each wall is located on a first side of the bend; and
   a second end of each wall is located on a second side of the bend.

6. The component-level cooling system of claim 5, wherein the second end of each wall is located proximate to the duct outlet.

7. A cooling system for an information handling system in a chassis comprising a plurality of panels, the cooling system comprising:
   a main fan for generating a main airflow in a first direction through the chassis to a first vent in a first panel of the plurality of panels, wherein the main airflow exits the first vent; and
   a component-level cooling system comprising:
      a fan in a housing coupled to a circuit board, the housing comprising:
         a fan inlet for receiving air from inside the chassis;
         a first fan outlet configured to direct a first airflow in the first direction toward the first vent; and
         a second fan outlet configured to direct a second airflow in a second direction opposite the first direction; and
      a duct comprising:
         a duct inlet coupled to the second fan outlet for receiving the second airflow;
         an elbow configured to redirect the second airflow in a third direction to avoid a collision with the main airflow; and
         a duct outlet located to avoid heated air exiting the second fan outlet from re-entering the fan inlet.

8. The cooling system of claim 7, wherein the duct outlet is located proximate to a second vent on a second panel of the chassis.

9. The cooling system of claim 8, wherein:
   the duct outlet is located on a side of a second end of the duct to redirect the second airflow in a fourth direction to exit the duct outlet.

10. The cooling system of claim 7, wherein the duct outlet is smaller than the duct inlet.

11. The cooling system of claim 7, wherein the elbow comprises a plurality of walls formed in at least a portion of the elbow to divide the elbow into a plurality of channels.

12. An information handling system in a chassis comprising a plurality of panels, the information handling system comprising:
   a plurality of components;
   a main fan for generating a main airflow in a first direction for cooling the plurality of components, wherein the main airflow exits a first vent in a first panel of the plurality of panels; and
   a component-level cooling system comprising:
      a fan in a housing coupled to a circuit board, the housing comprising:
         a fan inlet for receiving air from inside the chassis;
         a first fan outlet configured to direct a first airflow in the first direction toward the first vent; and
         a second fan outlet configured to direct a second airflow in a second direction opposite the first direction; and
      a duct comprising:
         a duct inlet coupled to the second fan outlet for receiving the second airflow;
         an elbow configured to redirect the second airflow in a third direction to avoid a collision with the main airflow; and
         a duct outlet located to avoid heated air exiting the second fan outlet from re-entering the fan inlet.

13. The information handling system of claim 12, wherein the duct outlet is located proximate to a second vent on a second panel of the chassis.

14. The information handling system of claim 13, wherein:
   the duct outlet is located on a side of a second end of the duct to redirect the second airflow in a fourth direction to exit the duct outlet.

15. The information handling system of claim 12, wherein the duct outlet is smaller than the duct inlet.

16. The information handling system of claim 12, wherein the elbow comprises a plurality of channels.

17. The information handling system of claim 12, comprising at least two component-level cooling systems, wherein each component-level cooling system comprises:
   a duct configured with a duct inlet to receive a second airflow, an elbow configured to redirect a second airflow associated with the component-level cooling system to avoid a collision with the main airflow, and a duct outlet located to avoid heated air from re-entering a fan inlet associated with any of the at least two component-level cooling systems.

18. The information handling system of claim 17, wherein at least one duct outlet is located inside the chassis.

\* \* \* \* \*